(12) United States Patent
Yanagimoto et al.

(10) Patent No.: US 10,491,151 B2
(45) Date of Patent: Nov. 26, 2019

(54) NOISE FILTER, CIRCUIT SUBSTRATE, AND POWER CONVERTER

(71) Applicant: KABUSHIKI KAISHA YASKAWA DENKI, Kitakyushu-shi (JP)

(72) Inventors: Tetsuo Yanagimoto, Kitakyushu (JP); Kenta Sasahara, Kitakyushu (JP)

(73) Assignee: KABUSHIKI KAISHA YASKAWA DENKI, Kitakyushu-Shi (JP)

(*) Notice: Subject to any disclaimer, the term of this patent is extended or adjusted under 35 U.S.C. 154(b) by 121 days.

(21) Appl. No.: 15/245,178

(22) Filed: Aug. 24, 2016

(65) Prior Publication Data

US 2017/0077801 A1 Mar. 16, 2017

(30) Foreign Application Priority Data

Sep. 11, 2015 (JP) .................. 2015-180032

(51) Int. Cl.
*H01F 27/06* (2006.01)
*H02P 27/06* (2006.01)
*H05K 1/02* (2006.01)
*H02M 1/12* (2006.01)
*H02M 1/14* (2006.01)
*H02M 7/00* (2006.01)

(52) U.S. Cl.
CPC .......... *H02P 27/06* (2013.01); *H05K 1/0233* (2013.01); *H02M 1/126* (2013.01); *H02M 1/14* (2013.01); *H02M 7/003* (2013.01); *H05K 2201/1003* (2013.01)

(58) Field of Classification Search
CPC .......... H02M 1/44; H02M 1/126; H02M 1/14; H02M 7/003; H03H 1/00; H03H 2001/0092; H05K 1/0233; H05K 220/1003; H02P 27/06; H01F 17/062; H01F 2017/065; H01F 2027/2833; H01F 27/33
USPC ............ 336/65, 175, 176, 173, 177, 83, 192
See application file for complete search history.

(56) References Cited

U.S. PATENT DOCUMENTS

| | | | | |
|---|---|---|---|---|
| 5,990,756 A | * | 11/1999 | France, Jr. | .............. H01F 17/06 174/121 A |
| 2010/0085778 A1 | * | 4/2010 | Saito | ..................... H01F 17/041 363/20 |
| 2016/0336846 A1 | * | 11/2016 | Walczak | ................. H01F 27/06 |

FOREIGN PATENT DOCUMENTS

| | | |
|---|---|---|
| EP | 531554 A1 * | 3/1993 |
| EP | 0531554 A1 | 3/1993 |
| JP | 64-21523 | 2/1989 |
| JP | 08-124754 | 5/1996 |
| JP | 08-124754 A * | 5/1996 |
| JP | 2005-093536 | 4/2005 |
| JP | 2010-199413 | 9/2010 |
| JP | 2011-192825 | 9/2011 |

(Continued)

OTHER PUBLICATIONS

Japanese Office Action for corresponding JP Application No. 2015-180032, dated Mar. 15, 2017 (w/ English machine translation).

(Continued)

*Primary Examiner* — Mang Tin Bik Lian
(74) *Attorney, Agent, or Firm* — Mori & Ward, LLP (57) ABSTRACT

A noise filter includes a magnetic core and a fixing member. The magnetic core includes a cylindrical integral body, and a wire is passed through the magnetic core. The fixing member is disposed inside the magnetic core and fixes the magnetic core to the wire.

18 Claims, 7 Drawing Sheets

(56) References Cited

FOREIGN PATENT DOCUMENTS

| JP | 2014-222974 | 11/2014 |
| JP | 2015-230947 | 12/2015 |
| JP | 2013-131290 A * | 7/2016 |
| JP | 2016-131290 | 7/2016 |

OTHER PUBLICATIONS

Japanese Office Action for corresponding JP Application No. 2015-180032, dated Nov. 8, 2016.
Chinese Office Action for corresponding CN Application No. 201610448169.2, dated Sep. 10, 2018.
Chinese Office Action for corresponding CN Application No. 201610448169.2, dated Apr. 29, 2019 (w/ machine translation).

* cited by examiner

NOISE FILTER, CIRCUIT SUBSTRATE, AND POWER CONVERTER

CROSS-REFERENCE TO RELATED APPLICATIONS

The present application claims priority under 35 U.S.C. § 119 to Japanese Patent Application No. 2015-180032, filed Sep. 11, 2015. The contents of this application are incorporated herein by reference in their entirety.

BACKGROUND

Field of the Invention

The embodiments disclosed herein relate to a noise filter, a circuit substrate, and a power converter.

Discussion of the Background

Japanese Unexamined Patent Application Publication No. 2011-192825 discloses an electromagnetic compatibility (EMC) filter unit that is applicable in inverters and that includes ring-shaped ferrite cores and cables passed through and wound around the ring-shaped ferrite cores.

SUMMARY

According to one aspect of the present disclosure, a noise filter includes a magnetic core and a fixing member. The magnetic core includes a cylindrical integral body, and a wire is passed through the magnetic core. The fixing member is disposed inside the magnetic core and fixes the magnetic core to the wire.

According to another aspect of the present disclosure, a power converter converts power fed from outside the power converter into control power to drive a motor, and includes a noise filter. The noise filter includes a magnetic core and a fixing member. The magnetic core includes a cylindrical integral body, and a wire is passed through the magnetic core. The fixing member is disposed inside the magnetic core and fixes the magnetic core to the wire.

According to the other aspect of the present disclosure, a circuit substrate includes a wire and a magnetic core. The wire includes a rigidity to stand on a surface of the circuit substrate. The magnetic core includes a cylindrical shape through which the wire is passed and which is supported by the wire.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

In the following description, the terms "frontward", "rearward", "leftward", "rightward", "upward", and "downward" used in relation to the inverter respectively correspond to the arrow-headed directions illustrated in FIG. 1 and other drawings. In this embodiment, these directions are defined according to a typical manner in which the inverter is installed. These directions, however, may vary as where to install the inverter may vary.

Figure 1:
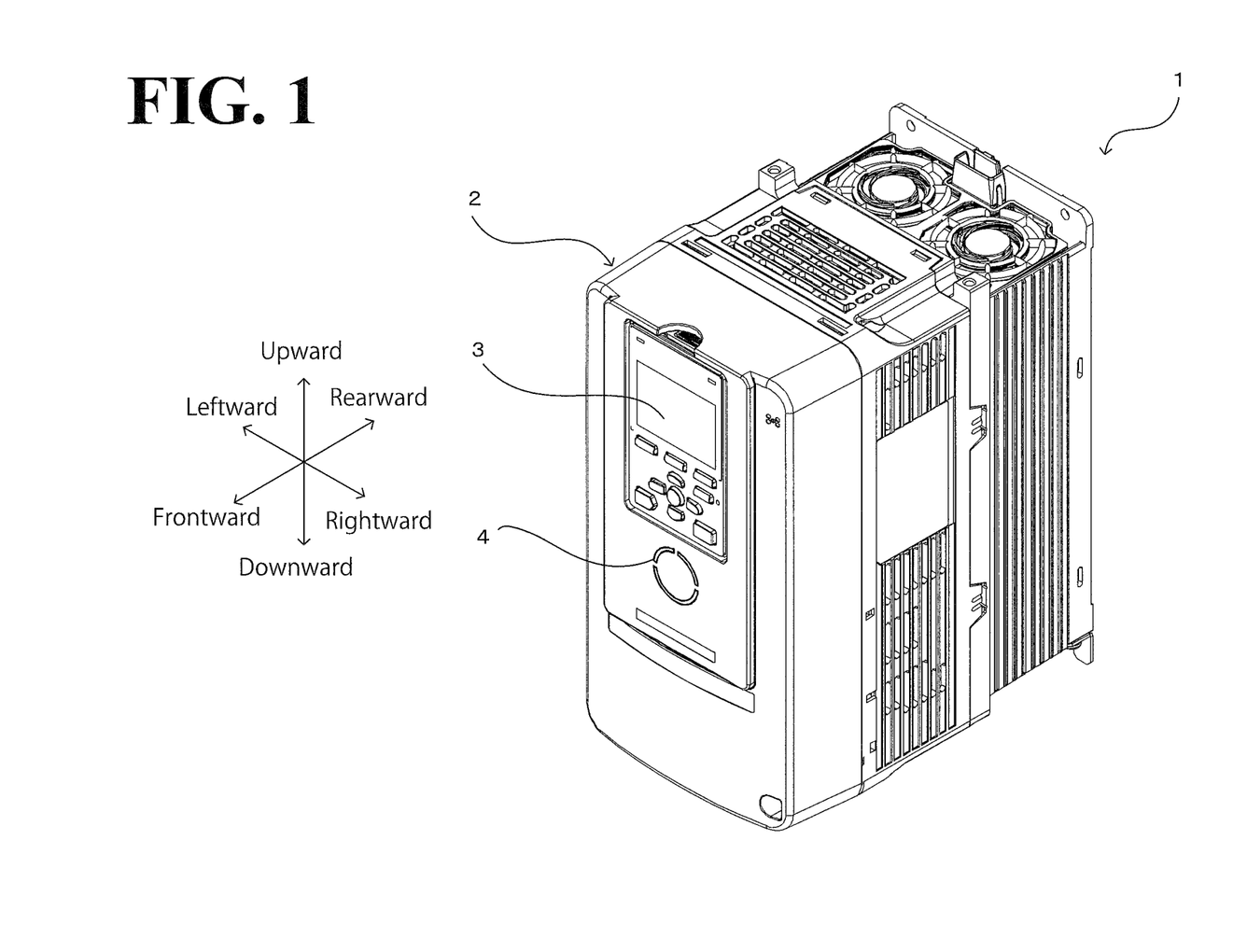
FIG. 1 is a perspective view of an inverter in its complete state, that is, with a noise filter according to an embodiment being provided in the inverter.

FIG. 1 is a perspective view of an inverter in its complete state, that is, with a noise filter according to this embodiment being provided in the inverter. Referring to FIG. 1, an inverter 1 is a power conversion apparatus that converts three-phase AC power supplied from outside into drive control power to be input into electric machinery such as a motor, not illustrated. The inverter 1 includes a housing 2, which has an approximately rectangular parallelepiped shape. On the front surface of the housing 2, an operator 3 and an indicator LED 4 are disposed. The operator 3 serves as a handling section and a display section of the inverter 1. The indicator LED 4 indicates how the inverter 1 is operating in simplified form.

Figure 2:
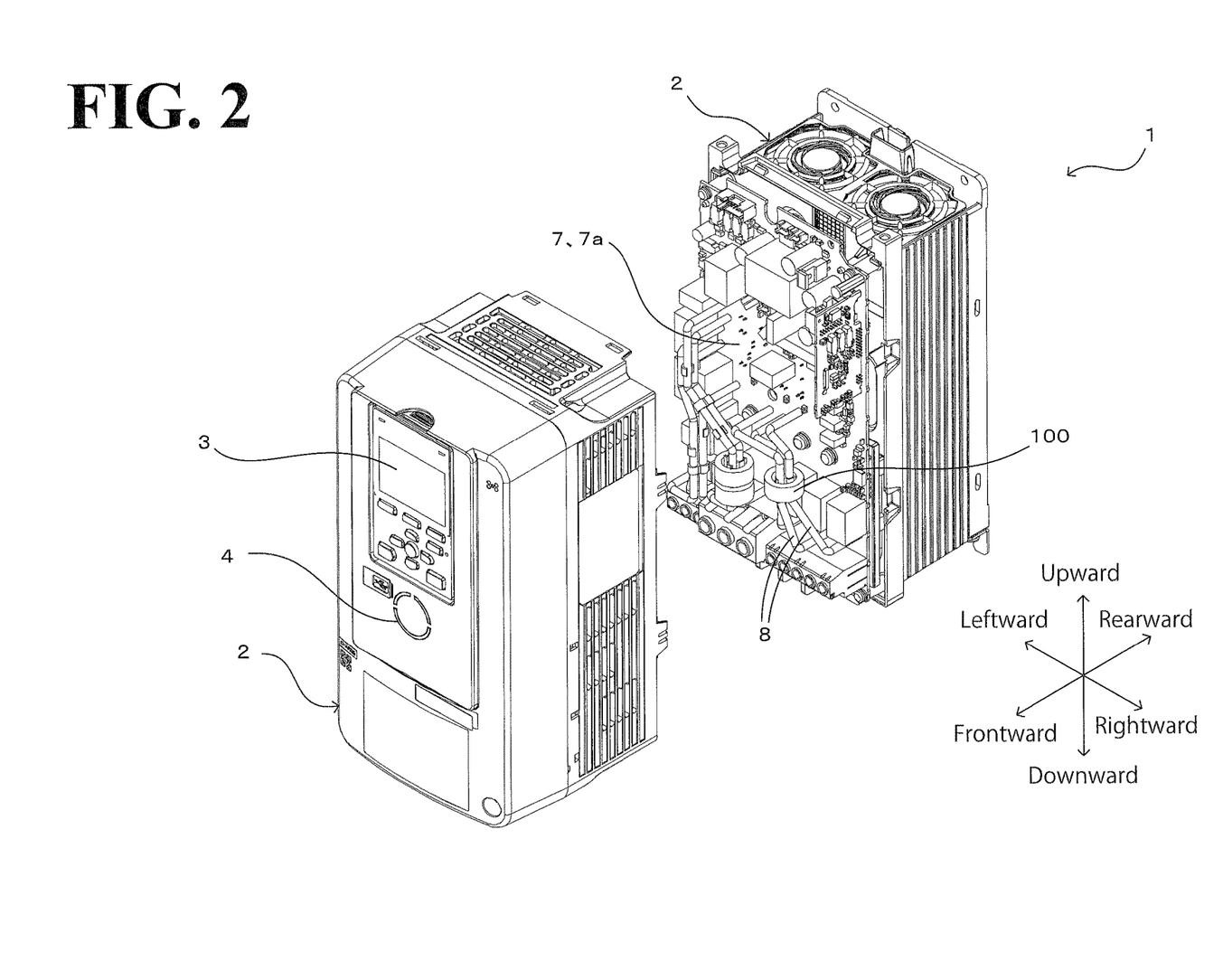
FIG. 2 is a partially exploded perspective view of the inverter.

FIG. 2 is a partially exploded perspective view of the inverter 1. Referring to FIG. 2, the housing 2 of the inverter 1 is dividable in the thickness directions (the frontward and rearward directions in FIG. 2) of its approximately rectangular parallelepiped shape so that a circuit substrate 7, which is accommodated in the housing 2, is removable. The circuit substrate 7 includes a mounting surface 7a (the frontward surface in the embodiment of FIG. 2). On the mounting surface 7a, a large number of electronic components and other related components are disposed, and various wires in jumper cables 8 are exposed and connect between particular portions.

Figure 3:
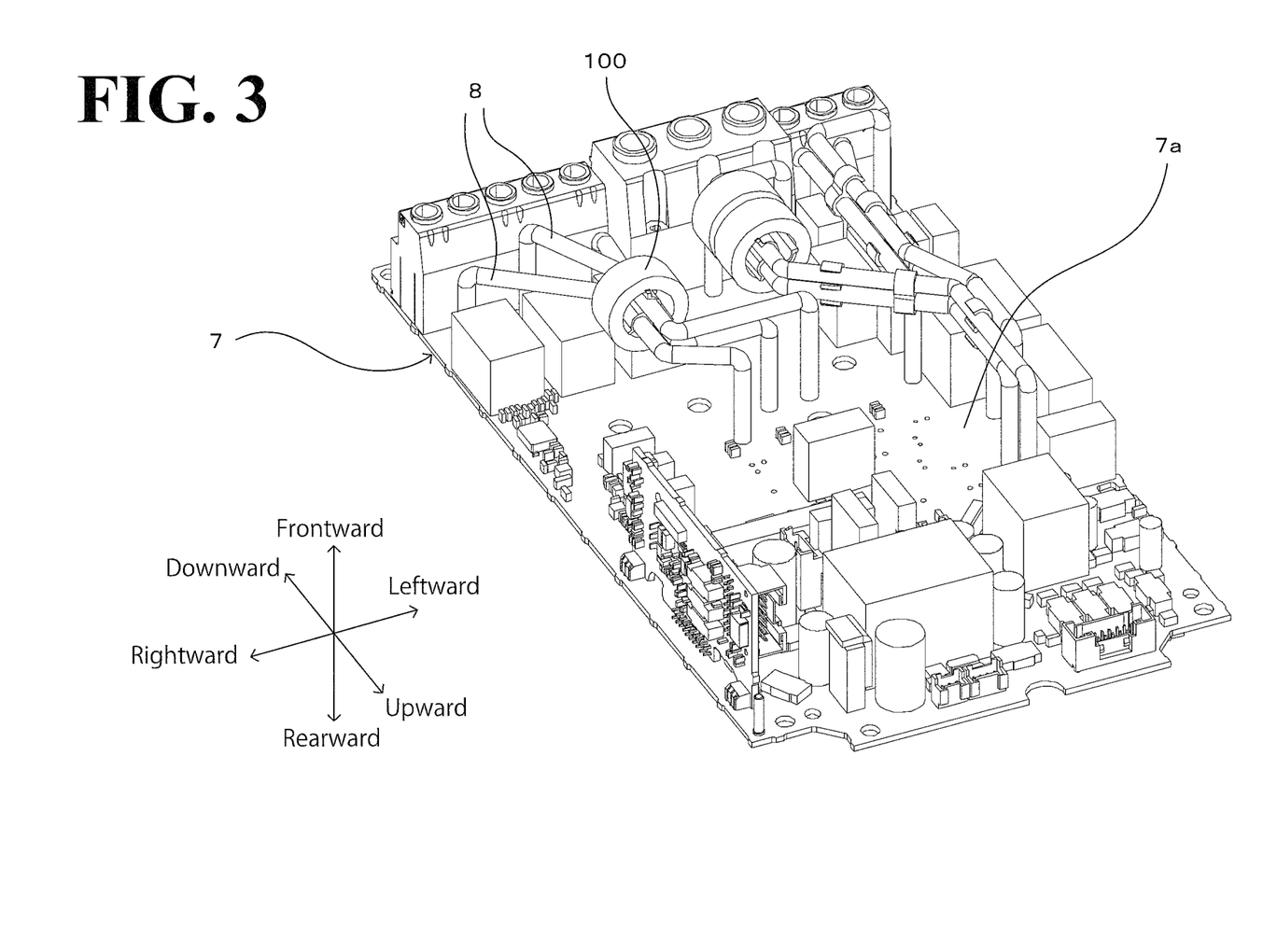
FIG. 3 is a perspective view of a circuit substrate illustrating how jumper cables with a noise filter are mounted on the circuit substrate with illustration of electronic components omitted.
Figure 4:
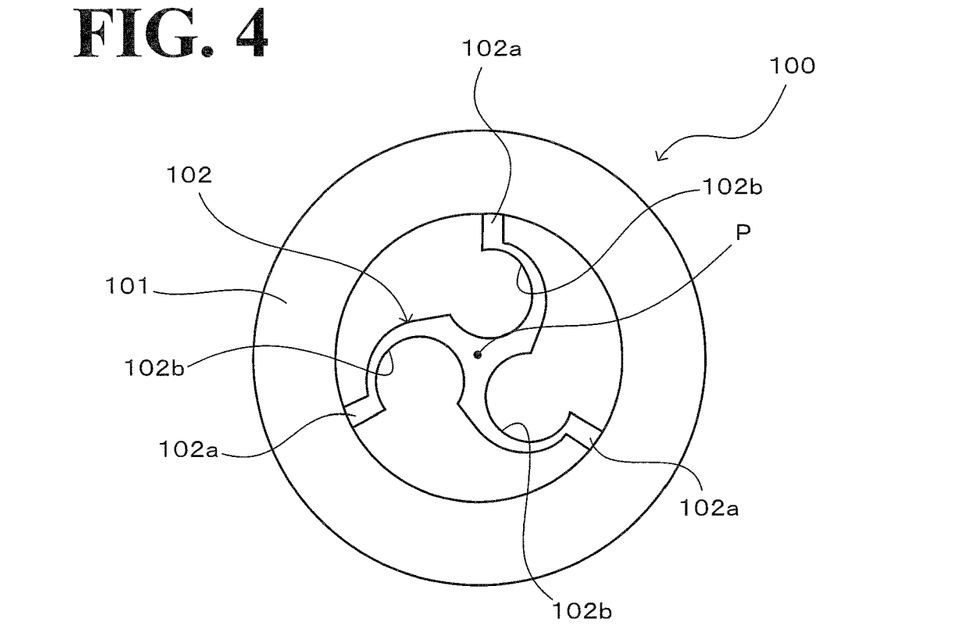
FIG. 4 is a front view of the noise filter.

FIG. 3 is an enlarged view of the circuit substrate 7 illustrating how jumper cables 8 with a noise filter 100 are mounted on the circuit substrate 7. In recent years, in the engineering of high-frequency power machines such as the inverter 1, there has been a growing demand for EMC (Electro-Magnetic Compatibility), which is defined as electromagnetic noninterference and resistance. In EMC, a measure against noise is to use the noise filter 100 with a magnetic core 101. As illustrated in FIGS. 3 and 4, the noise filter 100 includes the magnetic core 101, which has a cylindrical shape with a center hole in the ring shape. The jumper cables 8 are passed through the center hole. Thus, the magnetic core 101 and the jumper cables 8 make up a coil (inductor) that effects high levels of impedance with respect to high-frequency components flowing through the jumper cables 8, thereby removing noise.

There also has been a growing tendency for smaller-sized electronic components to be mounted on the circuit substrate 7, which in turn causes a growing tendency for higher density of the electronic components with respect to the mounting area of the circuit substrate 7. It is difficult, however, to make the noise filter 100 with the magnetic core 101 smaller in size because of the above-described physical action utilized by the noise filter 100 with the magnetic core 101. That is, the noise filter 100 with the magnetic core 101 occupies a comparatively large area on the mounting surface 7a of the circuit substrate 7, causing to decrease the number of electronic components mountable on the mounting surface 7a.

In view of this situation, in the inverter 1 according to this embodiment, the jumper cables 8 stand on the mounting surface 7a of the circuit substrate 7 and are passed through the magnetic core 101 of the noise filter 100. Thus, the jumper cables 8 support the noise filter 100 at an off-ground position distanced from the mounting surface 7a of the circuit substrate 7. This configuration eliminates the need for the space for the noise filter 100 on the mounting surface 7a of the circuit substrate 7, increasing the number of electronic components mountable on the mounting surface 7a. As a result, the inverter 1 is smaller in size while at the same time improving its functions.

Figure 5:
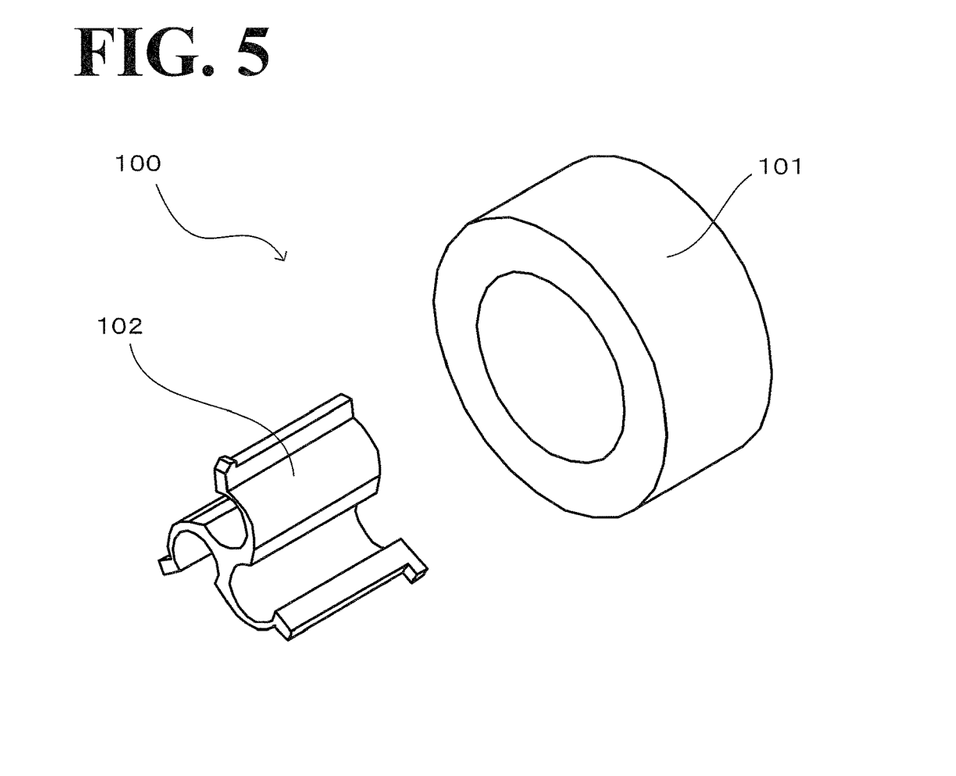
FIG. 5 is an exploded perspective view of the noise filter.

FIG. 4 is a front view of the noise filter 100. FIG. 5 is an exploded perspective view of the noise filter 100. Referring to FIGS. 4 and 5, the noise filter 100 includes the magnetic core 101 and a fixing member 102. The magnetic core 101 has a cylindrical shape. The fixing member 102 is fitted with the inner surface of the magnetic core 101.

The magnetic core 101 is a magnetic material of, for example, ferrite, and has a cylindrical shape that has a predetermined length in the axial direction and a predetermined thickness in the radial direction. That is, the magnetic core 101 has a cylindrical integral body (integral (unseparatable) structure).

The fixing member 102 fixes the magnetic core 101 to the jumper cables 8, and is fitted in advance with the inner surface of the magnetic core 101 (disposed inside the magnetic core 101). The fixing member 102 has an integral structure made of, for example, a resin material having elasticity. In the embodiment illustrated in FIGS. 4 and 5, the fixing member 102 has an approximately trifurcated shape intended for receiving three jumper cables 8. Specifically, the fixing member 102 includes three contact legs 102a. The contact legs 102a radially extend from the center axis, P, of the magnetic core 101 and are disposed at approximately uniform intervals around the center axis P. The contact legs 102a each include a fittable portion 102b adjacent to the center axis P to receive one of the jumper cables 8. The fittable portion 102b has an approximately cylindrical shape that is open approximately along the circumference of the magnetic core 101 and around the center axis P. In the embodiment illustrated in FIGS. 4 and 5, all the fittable portions 102b are open in the same circumferential direction (leftward in FIG. 4).

When the fixing member 102 is entirely fitted with the inner diameter of the magnetic core 101, the outer circumferential edges of the three contact legs 102a contact the inner surface of the magnetic core 101. In other words, the fixing member 102 supports the magnetic core 101 by contacting the inner surface of the magnetic core 101 at a plurality of positions located at approximately uniform intervals on the inner surface of the magnetic core 101. Thus, the approximately trifurcated shape of the fixing member 102 defines three equal regions aligned in the circumferential direction in the space of the inner diameter of the magnetic core 101.

Figure 6:
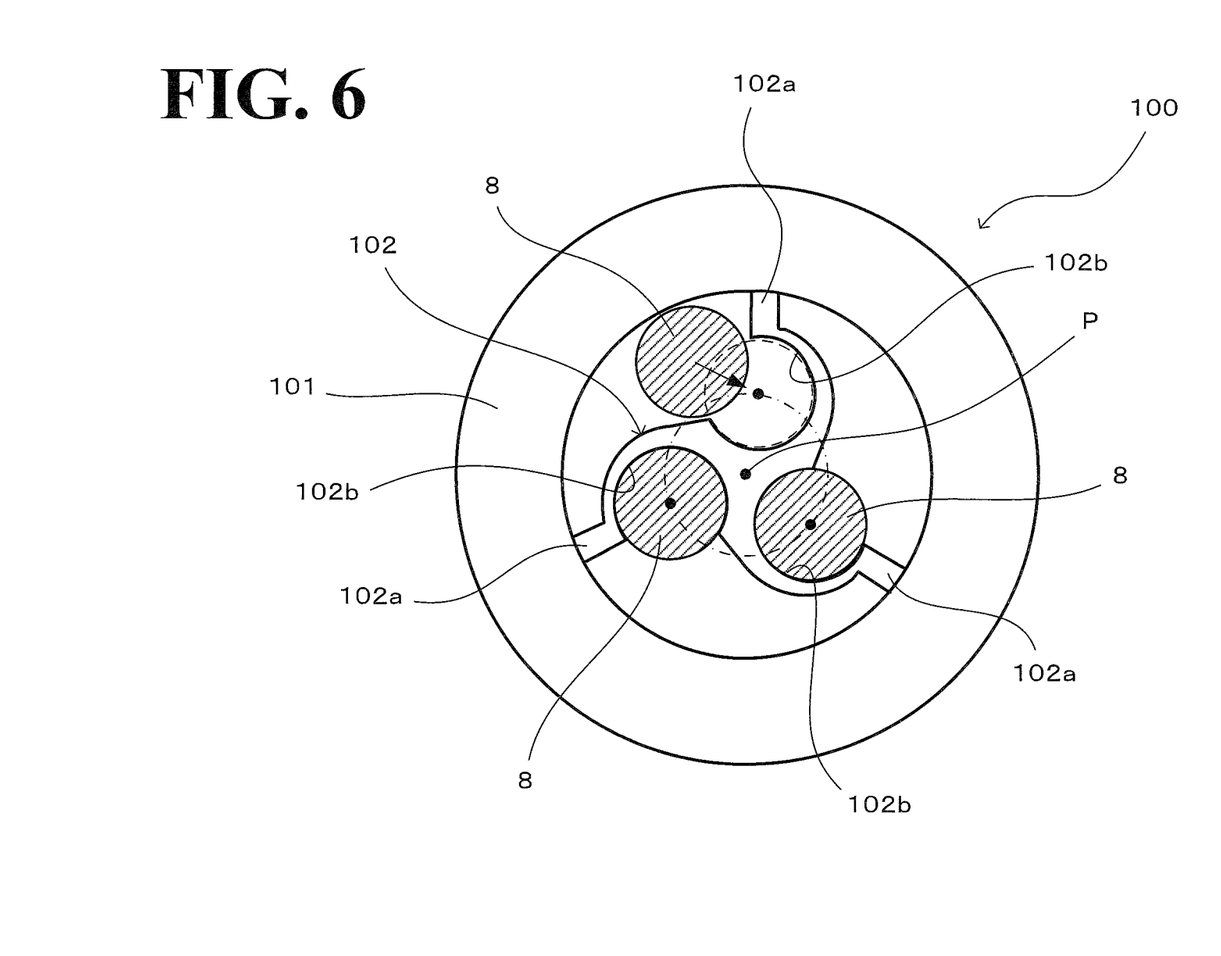
FIG. 6 is a front view of the noise filter illustrating how the jumper cables are fitted with the noise filter and arranged in the noise filter.

To mount the noise filter 100 with the above-described configuration to the jumper cables 8, first, the jumper cables 8 are passed through the respective three regions defined by the fixing member 102. Then, as illustrated in FIG. 6, which corresponds to FIG. 4, the jumper cables 8 are fitted with the respective fittable portions 102b. The inner diameter of each fittable portion 102b is approximately equal to the outer diameter of each jumper cable 8, and each fittable portion 102b is open by an angle corresponding to an inner circumferential angle smaller than 180 degrees. By forcing the jumper cable 8 into the opening of the fittable portion 102b in the circumferential direction, the fixing member 102 is elastically deformed to receive the jumper cable 8 in the fittable portion 102b. Then, the fittable portion 102b returns to its original shape to come into close contact with the jumper cable 8. In this manner, the fittable portion 102b reliably holds the jumper cable 8.

Thus, the three jumper cables 8 held by the fittable portions 102b of the fixing member 102 are bound together and aligned at approximately uniform intervals around the center axis P of the magnetic core 101 while keeping a distance from the inner surface of the magnetic core 101. With the jumper cables 8 held at positions distanced from the inner surface of the magnetic core 101 and aligned at approximately uniform intervals around the center axis P of the magnetic core 101, the noise filter 100 provides higher noise-removal efficiency with respect to the jumper cables 8.

Figure 7:
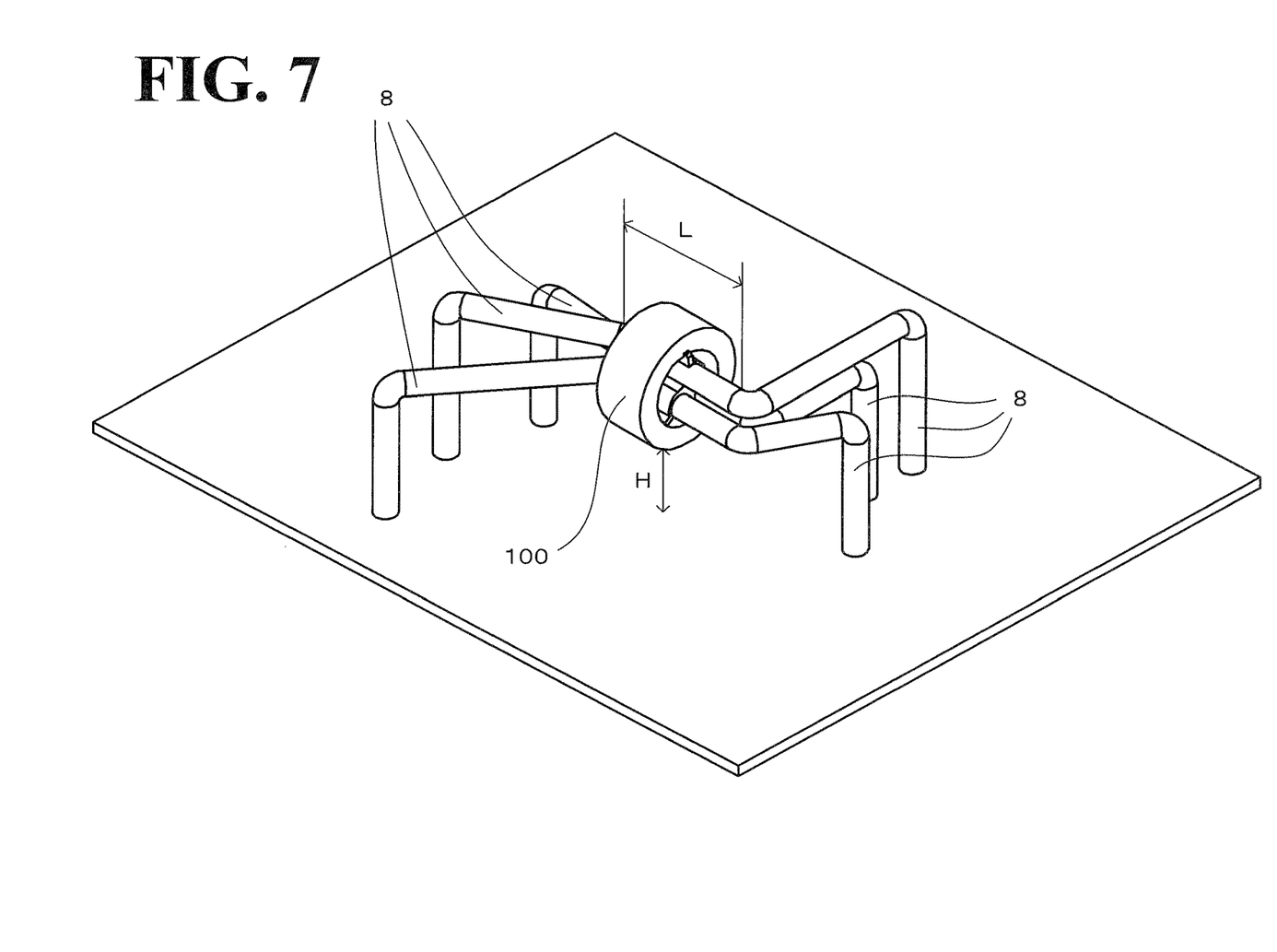
FIG. 7 is a perspective view of the noise filter illustrating how the noise filter is supported by the jumper cables.

As has been described hereinbefore, in this embodiment, the jumper cables 8 stand on the circuit substrate 7 to support the noise filter 100 at an off-ground position. As used herein, when the jumper cables 8 stand on the circuit substrate 7, the jumper cables 8 extend approximately perpendicular to the mounting surface 7a of the circuit substrate 7 or extend away from the mounting surface 7a by forming an angle equivalent to the approximately perpendicular extension with respect to the mounting surface 7a. Because of the structural nature of the fixing member 102, the jumper cables 8 fitted with the noise filter 100 are approximately parallel to each other in and adjacent the noise filter 100 as illustrated in FIG. 7. Otherwise, each of the jumper cable 8 bends at predetermined positions to connect between particular two portions.

All the jumper cables 8 are close and parallel to each other over a distance of L. As the distance L becomes shorter, the movable range of the noise filter 100 in the axial direction becomes narrower, that is, the noise filter 100 is supported more stably. In a possible embodiment, the distance between the mounting surface 7a of the circuit substrate 7 and the magnetic core 101, that is, the height, H, of the noise filter 100 is made large enough to avoid interferential contact between the noise filter 100 and other electronic components mounted on the circuit substrate 7. In another possible embodiment, each jumper cable 8 has a rigidity high enough to maintain the bendings and support the noise filter 100 at the off-ground position. The jumper cable 8 is a non-limiting example of the means recited in the appended claims. The means is passed through the cylindrical magnetic core to support the magnetic core at an off-ground position distanced from the substrate.

Advantageous Effects of this Embodiment

As has been described hereinbefore, the noise filter 100 of the inverter 1 according to this embodiment includes the fixing member 102 inside the cylindrical magnetic core 101. The fixing member 102 fixes the magnetic core 101 to the jumper cables 8. Specifically, the magnetic core 101 is fixed to a position along the jumper cables 8, which are rigid enough to stand on the circuit substrate 7, through the fixing member 102. Thus, instead of being fixed to the mounting surface 7a of the circuit substrate 7, the noise filter 100 is supported and fixed at an off-ground position that is distanced from the mounting surface 7a. This configuration eliminates the need for space for the noise filter 100 on the mounting surface 7a, increasing the number of electronic components mountable on the mounting surface 7a. As a result, the inverter 1 is smaller in size while at the same time improving its functions.

Also in this embodiment, the magnetic core 101 has a cylindrical shape. The cylindrical shape of the magnetic core 101 optimizes the convergence of the magnetic force lines around the jumper cables 8 passed through the center hole of the cylindrical shape, making the resulting inductance suitable for removing noise. Thus, noise removal performance improves. Insofar as a reliable level of noise removal performance is ensured, the magnetic core 101 may have other than the cylindrical shape. Another non-limiting example of the shape of the magnetic core 101 is an octagonal tube shape.

Also in this embodiment, the fixing member 102 has an elasticity that enables the fixing member 102 to receive and fix the jumper cables 8. That is, the fixing member 102 is elastically deformable to receive and fix the jumper cables 8. This configuration saves the labor of fixing the magnetic core 101 by soldering, screwing, or any other means, reducing the process step count and facilitating the mounting of the magnetic core 101 to the jumper cables 8.

Also in this embodiment, the fittable portions 102b of the fixing member 102 are open approximately along the circumference of the magnetic core 101 and around the center axis P of the magnetic core 101. This configuration eliminates the need for fitting the jumper cables 8 with an unfitted fixing member 102 and then mounting the assembly to the magnetic core 101. Instead, the above-described configuration facilitates integrating the magnetic core 101 and the fixing member 102 to each other in advance and then passing and fixing the jumper cables 8 through and to the fixing member 102. In another possible embodiment, the fittable portions 102b may be open in the radially outward direction from the center axis P of the magnetic core 101.

Also in this embodiment, the fixing member 102 is capable of binding the plurality of jumper cables 8 together. This configuration enables the fixing member 102 to accommodate to an increase in the number of the jumper cables 8 to support the noise filter 100, resulting in improved bearing strength (support strength) of the noise filter 100.

Also in this embodiment, the fixing member 102 fixes the jumper cables 8 at positions that are located at approximately uniform intervals around the center axis P of the magnetic core 101 and that are distanced from the inner surface of the magnetic core 101. This configuration keeps the plurality of jumper cables 8 from having direct contact with the magnetic core 101 and minimizes electromagnetic polarization, resulting in improved noise removal performance.

Also in this embodiment, the contact legs 102a of the fixing member 102 support the magnetic core 101 by contacting the inner surface of the magnetic core 101 at a plurality of positions located at approximately uniform intervals. This configuration facilitates the fitting of the fixing member 102 with the magnetic core 101 in the assembly work of the noise filter 100. In a possible embodiment, not illustrated, the fixing member 102 itself may have an integral, cylindrical fittable portion defining the circumference of the fixing member 102. This configuration makes more reliable the fitting of the fixing member 102 with the inner surface of the magnetic core 101.

Also in this embodiment, the noise filter 100 with the above-described configuration is provided in the inverter 1, which converts power fed from outside into drive control power to be input into electric machinery such as a motor. Thus, the noise filter 100 is applicable in the inverter 1, of which EMC compliance is particularly required.

Figure 8:
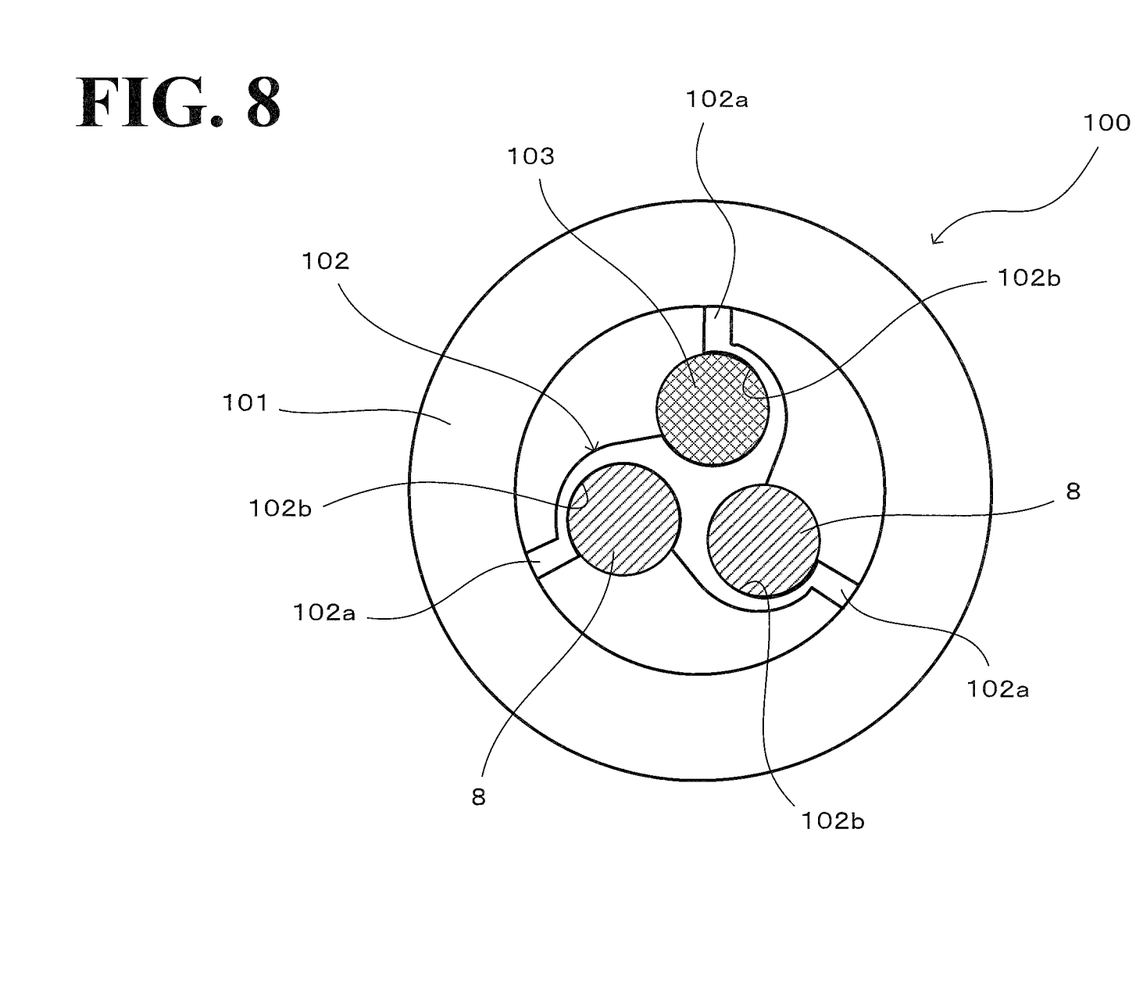
FIG. 8 is a front view of the noise filter fitted with two jumper cables and a single dummy pin.

Higher levels of noise can occur in three-phase AC wirings related to the drive control power output from the inverter 1. In order to eliminate or minimize the noise, it is effective to use three wires corresponding to the phases of the three-phase AC as the jumper cables 8 and pass the three wires through the magnetic core 101 of the noise filter 100. In another possible embodiment, the jumper cables 8 may be two DC wirings to be passed through the magnetic core 101 of the noise filter 100. In this case, it is possible to use the approximately trifurcated fixing member 102 to fix the two jumper cables 8 without making any changes to the fixing member 102, with a dummy pin 103 fitted with the empty single fittable portion 102b, as illustrated in FIG. 8, so as to keep the entire binding force balanced. In another possible embodiment, the magnetic core may have a larger inner diameter enough to enable the fixing member of the noise filter to bind and fix equal to or more than four jumper cables 8 (not illustrated). Depending on the magnitude of the current flowing through the jumper cables 8, it can be necessary to use four, six, or nine jumper cables 8, to be passed through the magnetic core and bound and fixed in the magnetic core.

Also in this embodiment, the circuit substrate 7 of the inverter 1 includes the jumper cables 8 and the magnetic core 101. The jumper cables 8 each have a rigidity to enable the jumper cables 8 to stand on the mounting surface 7a of the circuit substrate 7. The magnetic core 101 has a cylindrical shape and is supported by the jumper cables 8 passed through the magnetic core 101. This configuration eliminates the need for the space for the noise filter 100 on the mounting surface 7a of the circuit substrate 7, increasing the number of electronic components mountable on the mounting surface 7a. As a result, the inverter 1 is smaller in size while at the same time improving its functions.

As used herein, the term "approximately" is intended to provide a broader meaning to the adjective or preposition that follows the adverb, preventing the adjective or preposition from being construed in a strict sense. For example, "approximately along a circumference of the magnetic core" is intended to mean that there may be engineering-related and production-related tolerances and errors.

Otherwise, the above-described embodiments and modifications may be combined in any manner deemed suitable.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. A noise filter comprising:
   a magnetic core which comprises a cylindrical integral body, through which a wire is passed, and around which the wire is not wound; and
   a fixing member disposed inside the magnetic core and fixing the magnetic core to the wire,
   wherein the fixing member includes a plurality of fittable portions and a plurality of contact legs, each contact leg of the plurality of contact legs corresponds to a respective fittable portion of the plurality of fittable portions, the plurality of fittable portions each being a curved body extending from an inner end thereof to an outer terminal end thereof, the plurality of contact legs are each provided at the outer terminal end of the respective fittable portion of the plurality of fittable portions, the plurality of contact legs each linearly extend from the outer terminal end in radial directions of the cylindrical integral body when viewed along an axis of the cylindrical integral body, an outer terminal end surface of each of the plurality of contact legs contact an inner surface of the magnetic core, and wherein each curved body has an opening in a circumferential direction of the magnetic core, the opening being open by an inner circumferential angle of the curved body, the inner circumferential angle being smaller than 180 degrees, the opening abuts a respective contact leg of the plurality of contact legs.

2. The noise filter according to claim 1, wherein the magnetic core comprises a cylindrical shape.

3. The noise filter according to claim 1, wherein the fixing member comprises an elasticity to make the wire fitted with the fixing member.

4. The noise filter according to claim 3, wherein the fixing member is open approximately along a circumference of the magnetic core and around a center axis of the magnetic core.

5. The noise filter according to claim 1,
wherein the wire comprises a plurality of wires, and
wherein the fixing member is configured to bind the plurality of wires together.

6. The noise filter according to claim 5, wherein the fixing member fixes the plurality of wires at approximately uniform intervals around a center axis of the magnetic core while keeping the plurality of wires at a distance from an inner surface of the magnetic core.

7. The noise filter according to claim 1, wherein the fixing member is in contact with an inner surface of the magnetic core at a plurality of positions and at approximately uniform intervals on the inner surface of the magnetic core.

8. The noise filter according to claim 2, wherein the fixing member comprises an elasticity to make the wire fitted with the fixing member.

9. The noise filter according to claim 8, wherein the fixing member is open approximately along a circumference of the magnetic core and around a center axis of the magnetic core.

10. The noise filter according to claim 9,
wherein the wire comprises a plurality of wires, and
wherein the fixing member is configured to bind the plurality of wires together.

11. The noise filter according to claim 1, wherein the magnetic core is spaced apart from a circuit substrate in a direction substantially orthogonal to the circuit substrate.

12. A power converter to convert power fed from outside the power converter into control power to drive a motor, the power converter comprising a noise filter, the noise filter comprising:
a magnetic core which comprises a cylindrical integral body, through which a wire is passed, and around which the wire is not wound; and
a fixing member disposed inside the magnetic core and fixing the magnetic core to the wire,
wherein the fixing member includes a plurality of fittable portions and a plurality of contact legs, each contact leg of the plurality of contact legs corresponds to a respective fittable portion of the plurality of fittable portions, the plurality of fittable portions each being a curved body extending from an inner end thereof to an outer terminal end thereof, the plurality of contact legs are each provided at the outer terminal end of the respective fittable portion of the plurality of fittable portions, the plurality of contact legs each linearly extend from the outer terminal end in radial directions of the cylindrical integral body when viewed along an axis of the cylindrical integral body, an outer terminal end surface of each of the plurality of contact legs contact an inner surface of the magnetic core, and wherein each curved body has an opening in a circumferential direction of the magnetic core, the opening being open by an inner circumferential angle of the curved body, the inner circumferential angle being smaller than 180 degrees, the opening abuts a respective contact leg of the plurality of contact legs.

13. The power converter according to claim 12, wherein the wire comprises at least one of a wire compatible with a three-phase AC and a wire compatible with a DC.

14. The power converter according to claim 12, further comprising a circuit substrate,
wherein the magnetic core is spaced apart from the circuit substrate in a direction substantially orthogonal to the circuit substrate.

15. A circuit substrate comprising:
a wire comprising a rigidity to stand on a surface of the circuit substrate;
a magnetic core comprising a cylindrical shape through which the wire is passed, which is supported by the wire, and around which the wire is not wound; and
a fixing member disposed inside the magnetic core and fixing the magnetic core to the wire,
wherein the fixing member includes a plurality of fittable portions and a plurality of contact legs, each contact leg of the plurality of contact legs corresponds to a respective fittable portion of the plurality of fittable portions, the plurality of fittable portions each being a curved body extending from an inner end thereof to an outer terminal end thereof, the plurality of contact legs are each provided at the outer terminal end of the respective fittable portion of the plurality of fittable portions, the plurality of contact legs each linearly extend from the outer terminal end in radial directions of the cylindrical shape of the magnetic core when viewed along an axis of the cylindrical shape of the magnetic core, an outer terminal end surface of each of the plurality of contact legs contact an inner surface of the magnetic core, and wherein each curved body has an opening in a circumferential direction of the magnetic core, the opening being open by an inner circumferential angle of the curved body, the inner circumferential angle being smaller than 180 degrees, the opening abuts a respective contact leg of the plurality of contact legs.

16. The circuit substrate according to claim 15, further comprising a substrate,
wherein the magnetic core is spaced apart from the substrate in a direction substantially orthogonal to the substrate.

17. A circuit substrate comprising:
a wire comprising a rigidity to stand on a surface of the circuit substrate;
a magnetic core comprising a cylindrical shape through which the wire is passed; and
a fixing member disposed inside the magnetic core and fixing the magnetic core to the wire,
wherein the magnetic core is supported by the rigidity of the wire such that the magnetic core is supported by the wire to be spaced apart from the surface of the circuit substrate, and
wherein the fixing member includes a plurality of fittable portions and a plurality of contact legs, each contact leg of the plurality of contact legs corresponds to a respective fittable portion of the plurality of fittable portions, the plurality of fittable portions each being a curved body extending from an inner end thereof to an outer terminal end thereof, the plurality of contact legs are each provided at the outer terminal end of the respective fittable portion of the plurality of fittable portions, the plurality of contact legs each linearly extend from the outer terminal end in radial directions of the cylindrical shape of the magnetic core when viewed along an axis of the cylindrical shape of the magnetic core, an outer terminal end surface of each of the plurality of contact legs contact an inner surface of the magnetic core, and wherein each curved body has an opening in a circumferential direction of the magnetic core, the opening being open by an inner circumferential angle of the curved body, the inner circumferential angle being smaller than 180 degrees, the opening abuts a respective contact leg of the plurality of contact legs.

18. The circuit substrate according to claim 17, wherein the wire extends linearly through and is not wound around the magnetic core.

* * * * *